United States Patent
Fricker

(10) Patent No.: US 9,996,120 B1
(45) Date of Patent: Jun. 12, 2018

(54) PCB MODULE FOR INCREASED CONNECTIVITY

(71) Applicant: EMC Corporation, Hopkinton, MA (US)

(72) Inventor: Jean-Philippe Fricker, Mountain View, CA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 106 days.

(21) Appl. No.: 15/087,789

(22) Filed: Mar. 31, 2016

Related U.S. Application Data

(60) Provisional application No. 62/165,594, filed on May 22, 2015.

(51) Int. Cl.
*G06F 1/18* (2006.01)
*G06F 1/20* (2006.01)

(52) U.S. Cl.
CPC . *G06F 1/18* (2013.01); *G06F 1/20* (2013.01)

(58) Field of Classification Search
CPC .... G06F 1/18; G06F 1/20; H05K 1/14; H05K 1/141; H05K 1/144
See application file for complete search history.

(56) References Cited

U.S. PATENT DOCUMENTS

| | | | | |
|---|---|---|---|---|
| 6,859,370 B1* | 2/2005 | Hsu | ...................... | H01R 12/52 361/728 |
| 7,729,121 B1* | 6/2010 | Deshpande | ......... | H01L 23/3677 165/80.3 |
| 2001/0032738 A1* | 10/2001 | Dibene, II | ................ | G06F 1/18 174/260 |
| 2002/0057554 A1* | 5/2002 | Dibene, II | ................ | G06F 1/18 361/720 |
| 2002/0129974 A1* | 9/2002 | Smith | .................. | H05K 1/0263 174/260 |
| 2002/0196614 A1* | 12/2002 | DiBene, II | ................ | G06F 1/18 361/803 |
| 2003/0156400 A1* | 8/2003 | Dibene, II | ................ | G06F 1/18 361/803 |
| 2005/0270875 A1* | 12/2005 | Saeki | .................. | G06F 13/1684 365/222 |
| 2006/0043581 A1* | 3/2006 | Prokofiev | .............. | H05K 1/141 257/713 |
| 2006/0126297 A1* | 6/2006 | Belady | .................... | G06F 1/189 361/700 |
| 2006/0181857 A1* | 8/2006 | Belady | .................. | H01L 23/467 361/719 |
| 2012/0075807 A1* | 3/2012 | Refai-Ahmed | ......... | H01L 23/13 361/719 |
| 2013/0242496 A1* | 9/2013 | Ahmad | .................. | H05K 1/141 361/679.31 |

* cited by examiner

*Primary Examiner* — Hoa C Nguyen
*Assistant Examiner* — Christopher L Augustin
(74) *Attorney, Agent, or Firm* — Chamberlain Hrdlicka

(57) ABSTRACT

A printed circuit board (PCB) module that includes a processor package, an upper PCB and a lower PCB. The processor package includes a processor substrate and a processor. An upper socket is disposed on a lower surface of the upper PCB, and the upper socket electrically connects to a top electrical interface on the upper surface of the processor substrate. The lower PCB electrically interfaces with a bottom electrical interface on a lower surface of the processor substrate.

18 Claims, 10 Drawing Sheets

PCB MODULE FOR INCREASED CONNECTIVITY

CROSS-REFERENCE TO RELATED APPLICATIONS

This application claims priority to U.S. Provisional Patent Application No. 62/165,594 filed May 22, 2015, the entire disclosure of which is hereby expressly incorporated by reference herein.

BACKGROUND

Integrated circuits such as microprocessors increase in complexity and performance, resulting in a need for increased connectivity to interface with other electronic components. The electrical interface of an integrated circuit may be located on the surface of the chip package that houses the integrated circuit.

DETAILED DESCRIPTION

Figure 1A:
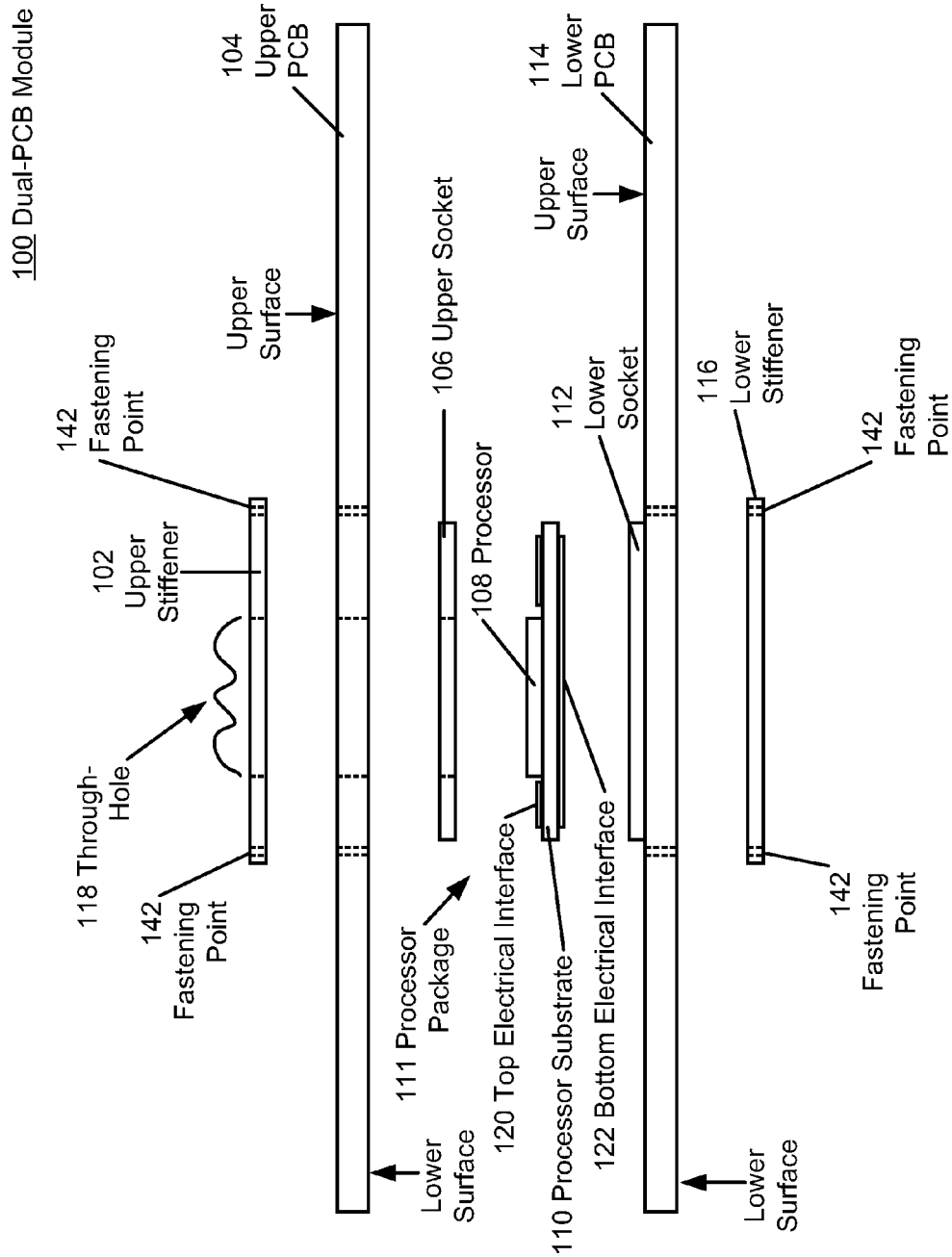
FIG. 1A shows an exploded side view of a printed circuit board (PCB) module in accordance with one or more embodiments of the technology.

Specific embodiments of the technology will now be described in detail with reference to the accompanying figures. Like elements in the various figures are denoted by like reference numerals for consistency.

In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments of the technology are directed to multiple printed circuit board (PCB) modules that enable increased connectivity to/from an integrated circuit that interfaces with the PCBs.

More specifically, in one or more embodiments of the technology, an integrated circuit such as a processor (e.g., a central processing unit (CPU), an application-specific integrated circuit (ASIC), a graphics processing unit (GPU), a digital signal processor (DSP), a field-programmable gate array (FPGA), etc.) may have an electrical interface with electrical contacts that are distributed in a manner such that a first group of electrical contacts interfaces with a first PCB and a second group of electrical contacts interfaces with a second PCB. In one or more embodiments of the technology, the first group of electrical contacts is located on a top surface of the integrated circuit, and the second group of electrical contacts is located on a bottom surface of the integrated circuit. Accordingly, a larger number of electrical contacts may be available in comparison to integrated circuits where all electrical contacts are located on a single surface. To electrically interface with its environment, the integrated circuit may be sandwiched between a top PCB and a bottom PCB that both include electric contacts that may mate with the electrical contacts at the top and bottom surfaces of the integrated circuit, respectively.

FIG. 1 shows an exploded side view of a PCB module (100) in accordance with one or more embodiments of the technology. The PCB module may include an upper PCB (104) and a lower PCB (114). The upper PCB or the lower PCB may be a motherboard or a backplane, or it may be any other board that interfaces with a motherboard or a backplane. The upper PCB (104) may have an upper stiffener (102) attached to its upper surface and an upper socket (106) attached to its lower surface. The lower PCB (114) may have a lower stiffener (116) attached to its lower surface and a lower socket (112) attached to its upper surface. The upper socket (106) and the lower socket (112) may thus face each other to accommodate an integrated circuit in between.

The PCB module may also include a processor package (111) that may have a processor substrate (110) and a processor (108) (e.g., CPU, GPU, FGPA, ASIC, etc.). The processor (108) may be covered by a lid (not shown), which may protect the processor and may also serve as a heat spreader. The processor package (111) may interface with the upper socket (106) and the lower socket (112) via a top and a bottom electrical interface (120, 122), respectively. The processor substrate (110) may be a ceramic, organic or silicon substrate. The top and bottom electrical interfaces on the top and bottom processor substrate (110) surfaces, respectively, may provide connectivity to/from the processor (108). The top and bottom electrical interfaces (120, 122) of the processor may be electrical contacts, e.g., pins (pin grid array (PGA) style), pads (land grid array (LGA) style), solder balls (ball grid array (BGA) style), or combinations thereof. The entire bottom surface or only regions on the bottom surface of the processor substrate (110) may be used to accommodate the bottom electrical interface (122). Further, the top surface of the processor substrate (110), in a region surrounding the processor (108) may accommodate the top electrical interface (120).

The upper and lower sockets (106, 112), in accordance with an embodiment of the technology, are configured to mate with the top and bottom electrical interfaces (120, 122) of the processor package (111). Accordingly, the upper and lower sockets (106, 112) may be PGA, LGA or BGA sockets that may, upon assembly of the PCB module (100), reversibly or irreversibly connect to the top and bottom electrical interface (120, 122), respectively. No socket may be necessary if the processor package (111) is equipped with a BGA or LGA-style electrical interface. For example, if the bottom electrical interface (122) is a BGA-style electrical interface, the bottom electrical interface (122) may directly interface with the lower PCB (114). Such a processor package may, however, still require a socket for the top electrical interface (120), for example, if the top electrical interface is a PGA-style electrical interface. In scenarios in which the conservation of space is a priority (e.g. mobile applications), a BGA or LGA-style bottom electrical interface (122) without a socket and a pin or pad-based top electrical interface (120) in conjunction with an upper socket (106) may be used. In contrast, in scenarios where a processor is required to be exchangeable (e.g., in desktop or server applications), pin or pad-based electrical interfaces may be used for the top and bottom electrical interfaces (120, 122).

The upper and lower stiffeners (102, 116), in accordance with an embodiment of the technology, may provide a mechanical reinforcement to the upper and lower PCBs (104, 114), respectively, in particular in the area of the upper and lower sockets (106, 112). The upper stiffener (102) and the lower stiffener (116) may provide structural rigidity to the upper PCB (104) and lower PCB (114), respectively, and may ensure that even in presence of mechanical forces (e.g., during the assembly of the PCB module), the upper and lower PCBs remain planar. The upper and lower stiffeners (102, 116) may be, for example, metal, plastic, ceramic or composite material plates that are mechanically attached to the upper and lower PCB (104, 114), respectively. The upper stiffener (102) and the lower stiffener (116) may have one or more fastening points (142). Further, the upper PCB (104) and the lower PCB (114) may also have one or more fastening points (142). The fastening points may be, for example, screw holes, screws, bolts, springs, adhesives or retention clips to securely fasten the stiffeners to their respective PCBs. In one or more embodiments, the fastening points may extend all the way from the upper stiffener (102) to the lower stiffener (116) in order to securely fasten all of the components of the PCB module.

In one or more embodiments, each of the upper PCB (104), upper stiffener (102), and upper socket (106) may have a through-hole (118). The through-hole(s) may be adapted to accommodate, for example, a heat sink or the processor (108).

Figure 1B:
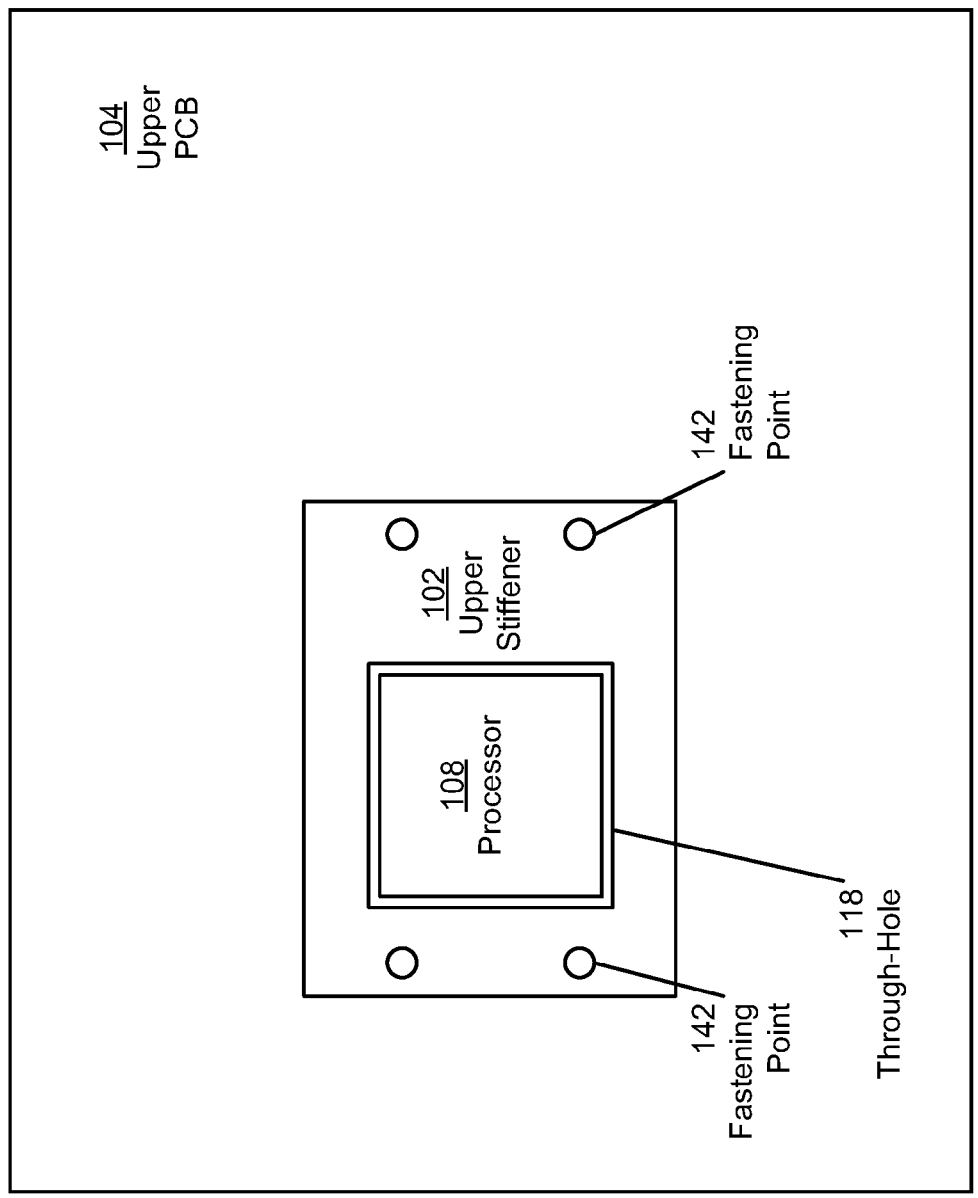
FIG. 1B shows a top view of a PCB module in accordance with one or more embodiments of the technology.

FIG. 1B shows a top view of a PCB module in accordance with one or more embodiments of the technology. The top view of the PCB module shows the upper PCB (104) and the upper stiffener (102) installed on the upper PCB. Further, in this view, the processor (108) (or the lid covering the processor) may be visible through one or more through-holes (118) of the upper PCB (104), upper stiffener (102), and the upper socket (106). In one or more embodiments, the processor (108) may be of varying height such that it may be recessed into the through-hole (118), it may be flush with the upper stiffener (102), or it may protrude through the upper stiffener (102). Additionally, the upper stiffener also may have one or more fastening points (142) to securely fasten the upper stiffener (102) to the upper PCB (104).

Figure 2:
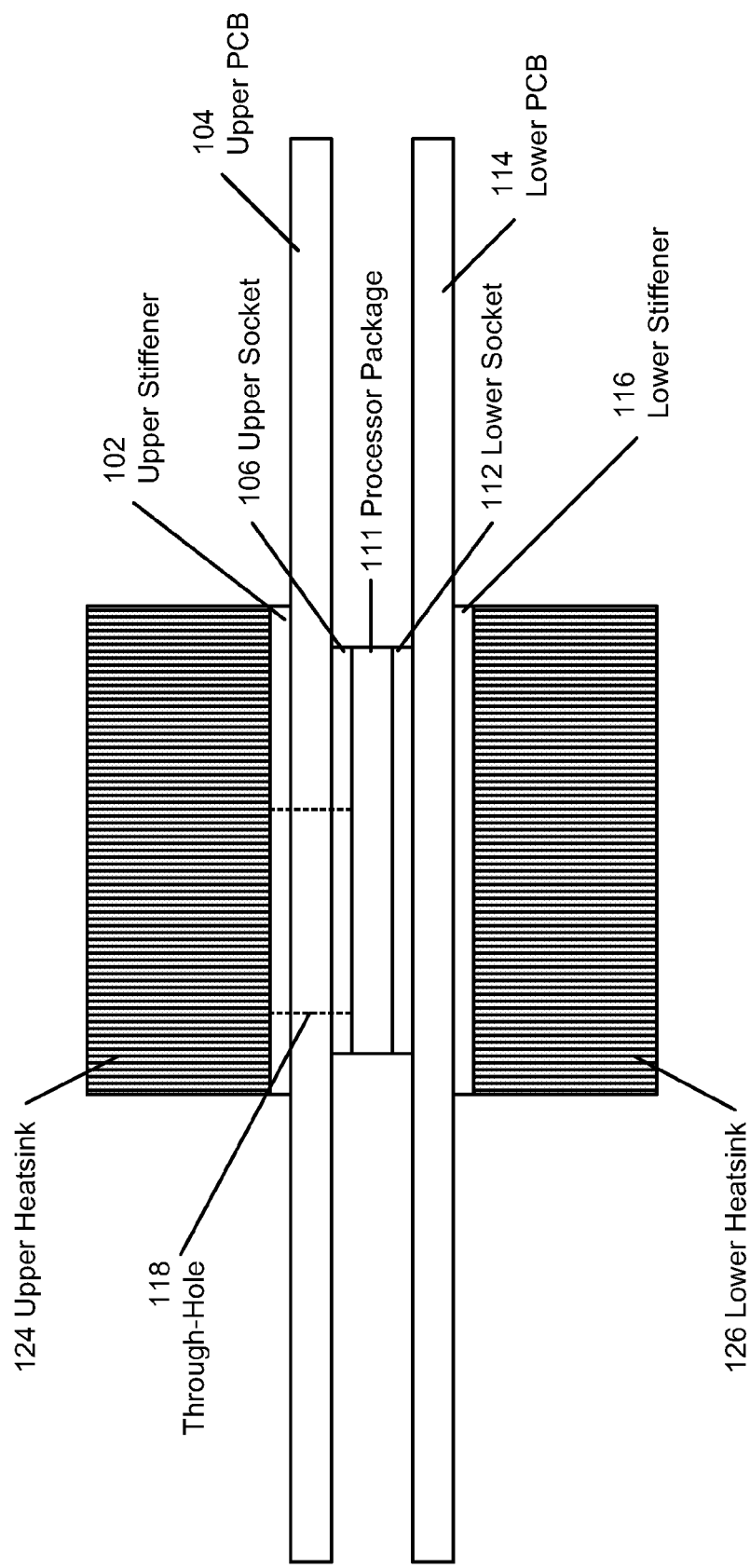
FIG. 2 shows a side view of a PCB module with an upper heatsink and a lower heatsink in accordance with one or more embodiments of the technology.

FIG. 2 shows a side view of a PCB module that includes an upper heatsink (124) and a lower heatsink (126) in accordance with one or more embodiments of the technology. The PCB module according to FIG. 2 may have an upper socket (106), processor package (111), and lower socket (112) sandwiched between the upper PCB (104) and lower PCB (114). In one embodiment of the technology, the upper PCB (104) and lower PCB (114) are equal in size.

Additionally, the upper PCB (104) may have an upper stiffener (102) attached to its upper surface, with the upper heatsink (124) mounted to the upper stiffener (102). The lower PCB (114) may have a lower stiffener (116) attached to its lower surface, with the lower heatsink (126) mounted to the lower stiffener (116). In one embodiment of the technology, as shown in FIG. 2, the upper heatsink (124) and the lower heatsink (126) are of equal heights.

The dotted lines in FIG. 2 indicate a through-hole(s) (118) similar to that shown in FIGS. 1A and 1B. The processor package (111) may protrude through none, all, or a portion of the through-hole. Further, the upper heatsink (124) may also protrude through none, all, or a portion of the through-hole. Alternatively, a thermal interface material (not shown) may be inserted in the through-hole between the processor package (111) and the upper heatsink (124) to facilitate thermal coupling between the upper heatsink and the processor package (111).

The lower heatsink (126), in accordance with an embodiment of the technology, is in surface contact with the lower stiffener (116), which in turn is in surface contact with the lower PCB (114). Heat may thus be conducted away from the processor package (111) via the lower PCB (114) and the lower stiffener (116) to the lower heatsink (126), from where it may be dissipated to the surrounding environment. Vias within the processor package, in particular power vias that may have a significant cross-sectional area, may also conduct heat from the heat sources within the processor toward the bottom of the processor package, from where the heat may be transferred to the lower PCB (114). If a lower socket (112) is used for seating the processor package (111) (e.g., for PGA-style or LGA-style processor packages), the heat may be conducted via the electrical connections in the lower socket (112). Alternatively, if no socket is used (e.g., for BGA-style processor packages or LGA-style surface mounted processor packages), the heat may directly transferred from the processor package to the lower PCB (114).

Figure 3:
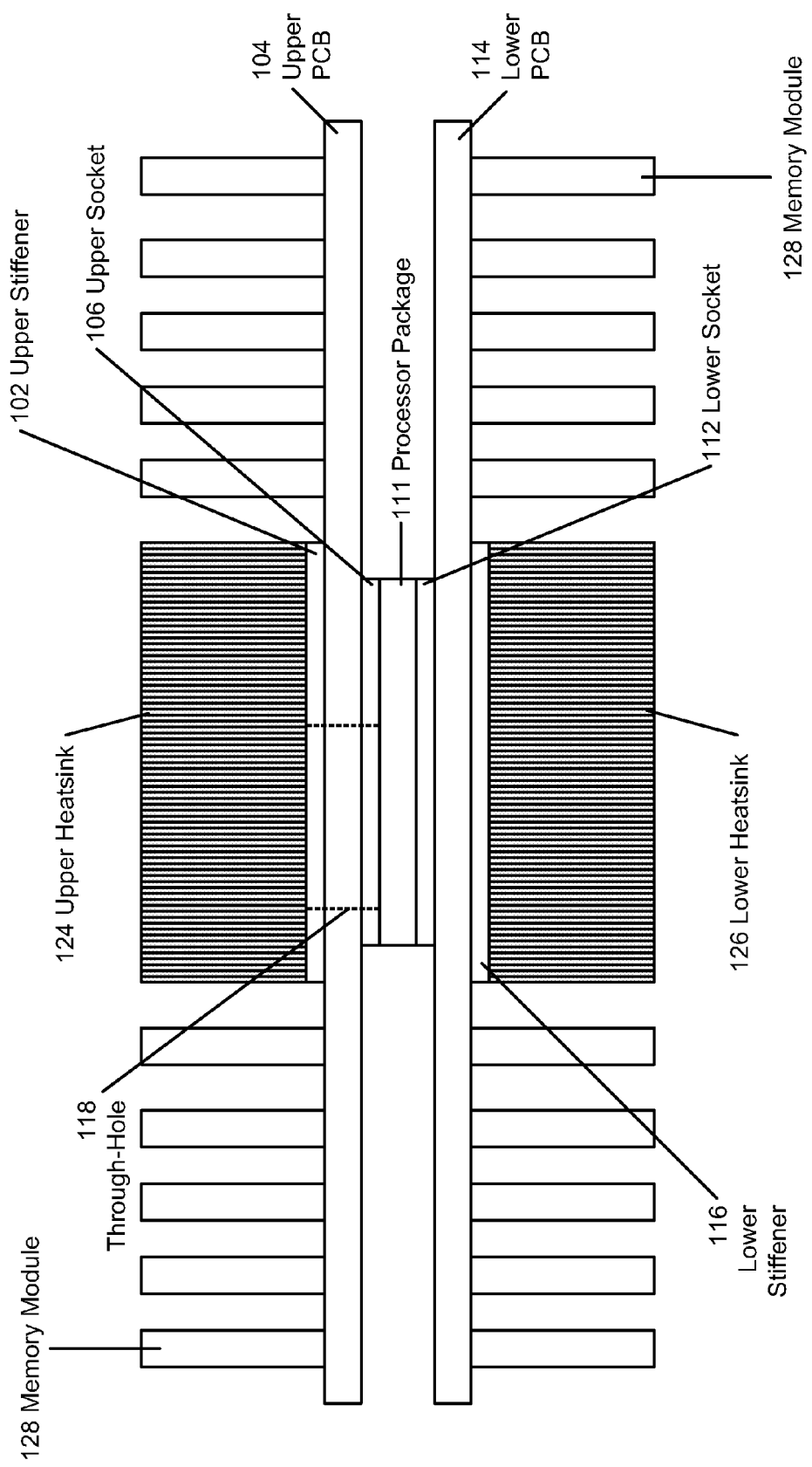
FIG. 3 shows a side view of a PCB module with an upper heatsink, a lower heatsink, upper memory modules, and lower memory modules in accordance with one or more embodiments of the technology.

FIG. 3 shows a side view of a PCB module that includes an upper heatsink (124), a lower heatsink (126) and memory modules and/or devices (128) (e.g., volatile memory modules that may include, but is not limited to, Dynamic Random-Access Memory (DRAM), Synchronous DRAM, SDR SDRAM, and DDR SDRAM), in accordance with one or more embodiments of the technology. The memory modules (128) may be seated on the upper PCB (104), the lower PCB (114) or on the upper and lower PCBs, as shown in FIG. 3. The PCB module shown in FIG. 3, in accordance with an embodiment of the technology, has an upper socket (106), a processor package (111), and a lower socket (112) sandwiched between the upper PCB (104) and the lower PCB (114). If the processor package (111) is surface mounted, no socket(s) may be used.

Additionally, an upper stiffener (102) may be installed on the upper surface of the upper PCB (104), with an upper heatsink (124) mounted to the upper stiffener (102). A lower stiffener (116) may be installed on the lower surface of the lower PCB (114), with a lower heatsink (126) mounted to the lower stiffener (116). The memory modules (128) may be installed on the upper surface of the upper PCB (104) and/or on the lower surface of the lower PCB (114). In one or more embodiments of the technology, the height of the heatsinks is chosen to match the height of the memory modules to facilitate consistent air flow, as shown in FIG. 3.

Figure 4:
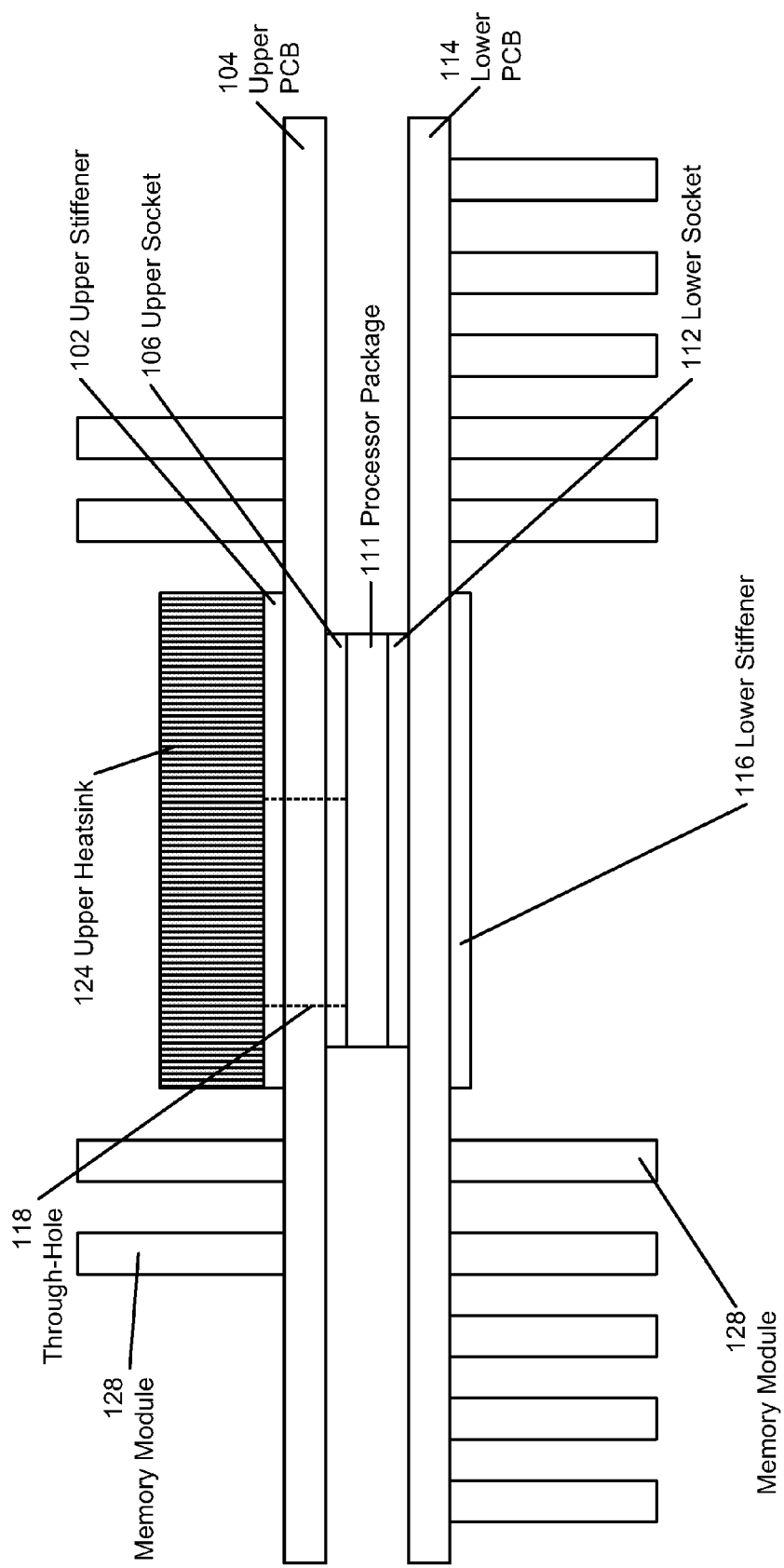
FIG. 4 shows a side view of a PCB module with a shortened upper heatsink in accordance with one or more embodiments of the technology.

FIG. 4 shows a side view of a PCB module with a shortened upper heatsink (124) in accordance with one or more embodiments of the technology. The PCB module shown in FIG. 4 includes an upper socket (106), a processor package (111), and lower socket (112) sandwiched between the upper PCB (104) and the lower PCB (114), in accordance with an embodiment of the technology.

Additionally, in accordance with an embodiment of the technology, an upper stiffener (102) is installed on the upper surface of the upper PCB (104), with an upper heatsink (124) mounted to the upper stiffener (102). Further, a lower stiffener (116) is installed on the lower surface of the lower PCB (114).

A set of memory modules (128) may be installed on the upper surface of the upper PCB (104) and/or on the lower surface of the lower PCB (114).

Figure 5:
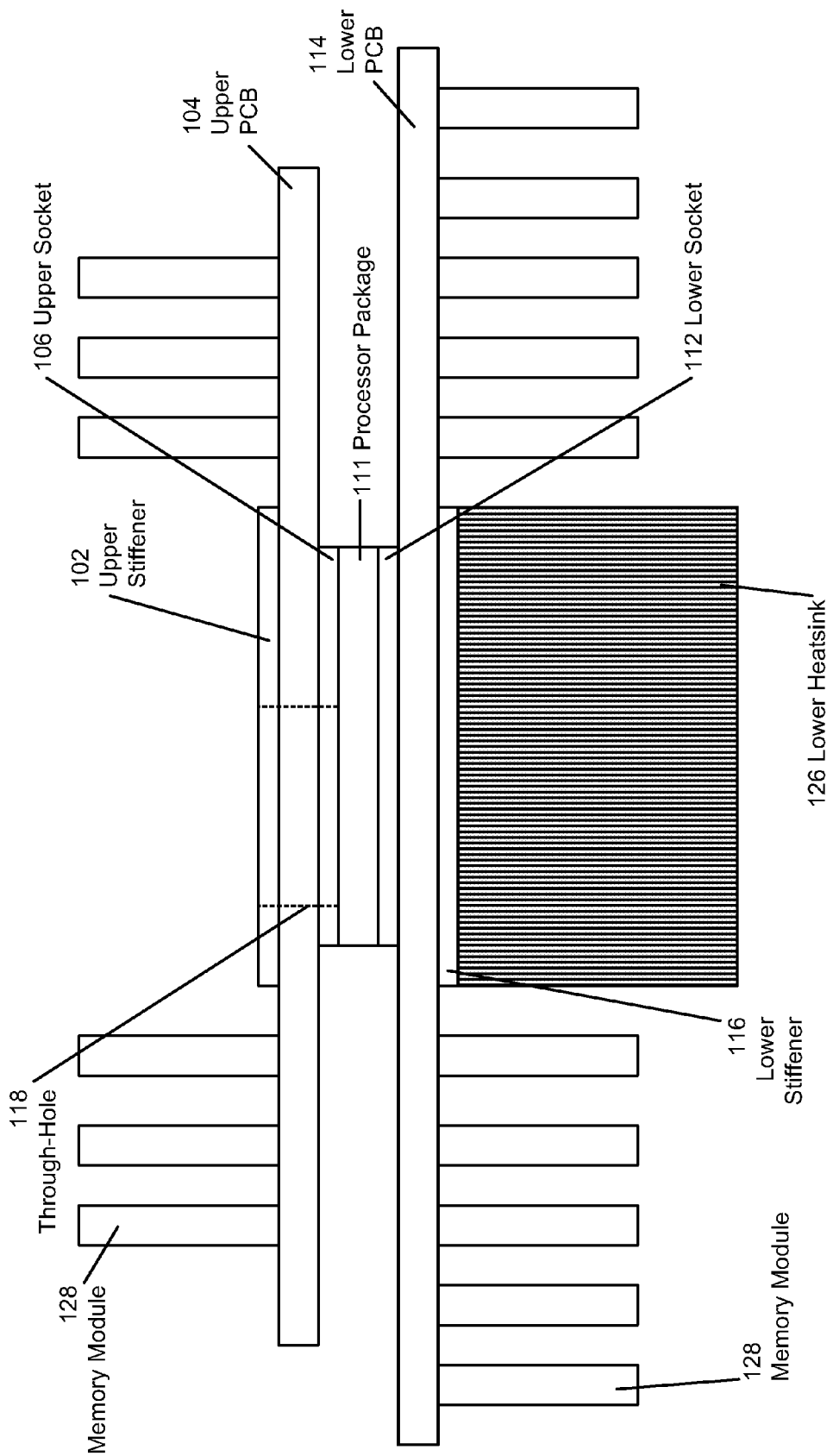
FIG. 5 shows a side view of a PCB module with a narrow upper PCB and a lengthened lower heatsink in accordance with one or more embodiments of the technology.

FIG. 5 shows a side view of a PCB module with a narrow upper PCB (104) and a lengthened lower heatsink (126), in accordance with one or more embodiments of the technology. The PCB module shown in FIG. 5 includes an upper socket (106), a processor package (111), and lower a socket (112) sandwiched between the upper PCB (104) and the lower PCB (114).

In one or more embodiments of the technology, the upper PCB (104) is narrower than the lower PCB (114). An upper stiffener (102) is installed on the upper surface of the upper PCB (104) and a lower stiffener (116) is installed on the lower surface of the lower PCB (114), with a lower heatsink (126) mounted to the lower stiffener (116), in accordance with an embodiment of the technology.

Memory modules (128) may be installed on the upper and lower surfaces of the upper PCB (114) and the lower PCB (114), respectively. The heatsink (126) installed on the lower stiffener may extend beyond the memory modules, as illustrated in FIG. 5.

Figure 6:
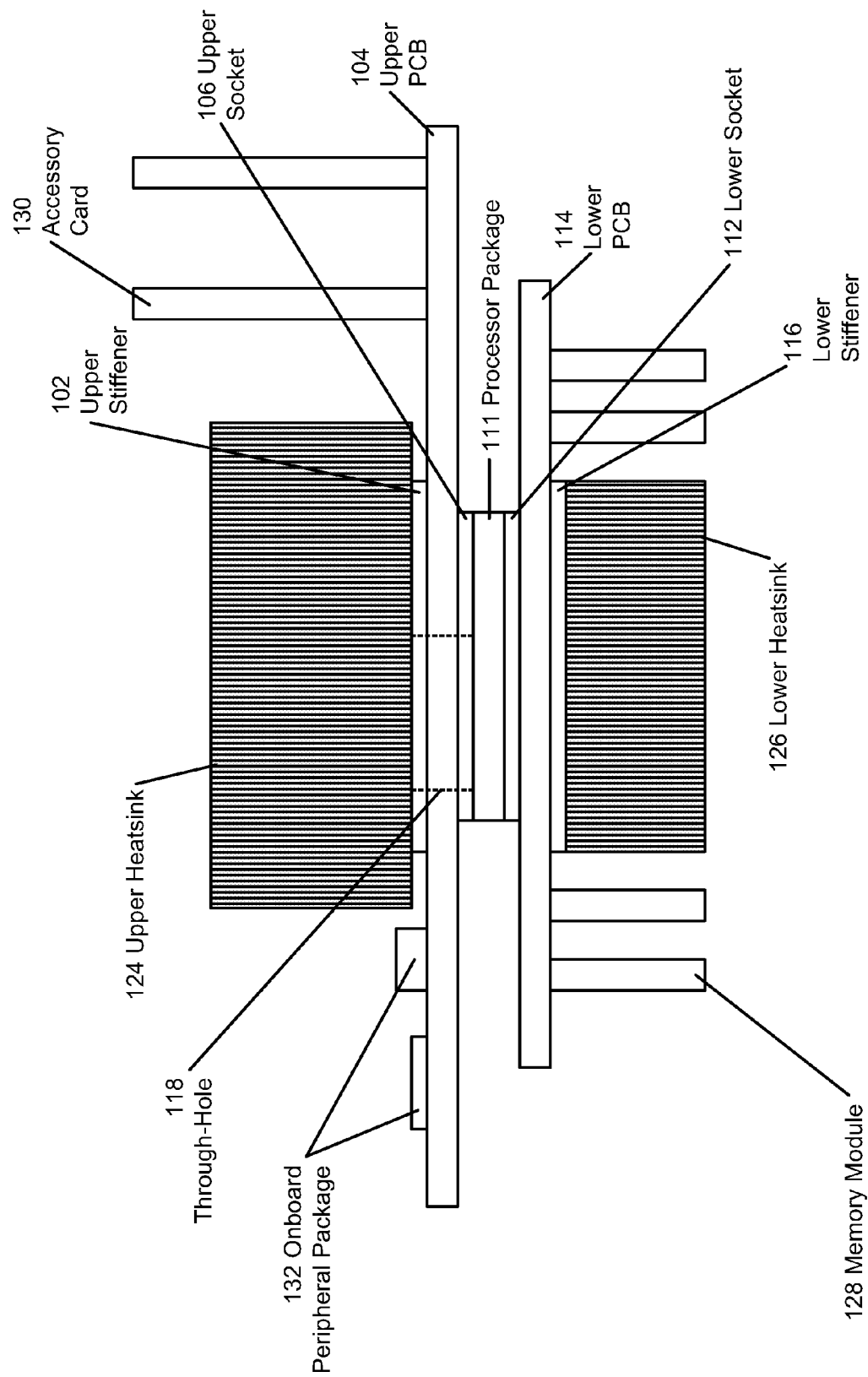
FIG. 6 shows a side view of a PCB module with a narrow lower PCB, various height accessory cards, and onboard peripheral packages in accordance with one or more embodiments of the technology.

FIG. 6 shows a side view of a PCB module with a narrow lower PCB (114), accessory cards (130) that may be of different heights, and onboard peripheral packages (132) in accordance with one or more embodiments of the technology. The PCB module shown in FIG. 6 has an upper socket (106), a processor package (111), and a lower socket (112) sandwiched between the upper PCB (104) and the lower PCB (114).

In one or more embodiments of the technology, the upper PCB (104) is wider than the lower PCB (114). One or more memory modules (128) may be installed on the lower surface of the lower PCB (114). One or more accessory cards (130) may be installed on the upper surface of the upper PCB (104). The accessory cards may be, for example, graphics cards, networking cards, redundant array of independent disks (RAID) etc. The accessory cards may be connected by, for example, a peripheral component interconnect (PCI) or PCI Express slot. However, the accessory cards are not limited to the foregoing examples and one of ordinary skill in the art would readily appreciate that many different types of interchangeable accessory cards may be installed.

Additionally, the upper PCB (104) also may have one or more onboard peripheral packages (132). The onboard peripheral packages may be, for example, chips for Ethernet, USB, audio, graphics, transceivers, and/or other input/output functions.

The upper PCB (104), in accordance with an embodiment of the technology, includes an upper stiffener (102) attached to the upper surface and the lower PCB (114) includes a lower stiffener (116) attached to the lower surface. The upper stiffener (102) may have an upper heatsink (124) installed on its upper surface. In one embodiment of the technology, the upper heatsink (124) is wider than the upper stiffener (102), as shown in FIG. 6. Further, a lower heatsink (126) may be installed on the lower surface of the lower stiffener (116).

Figure 7:
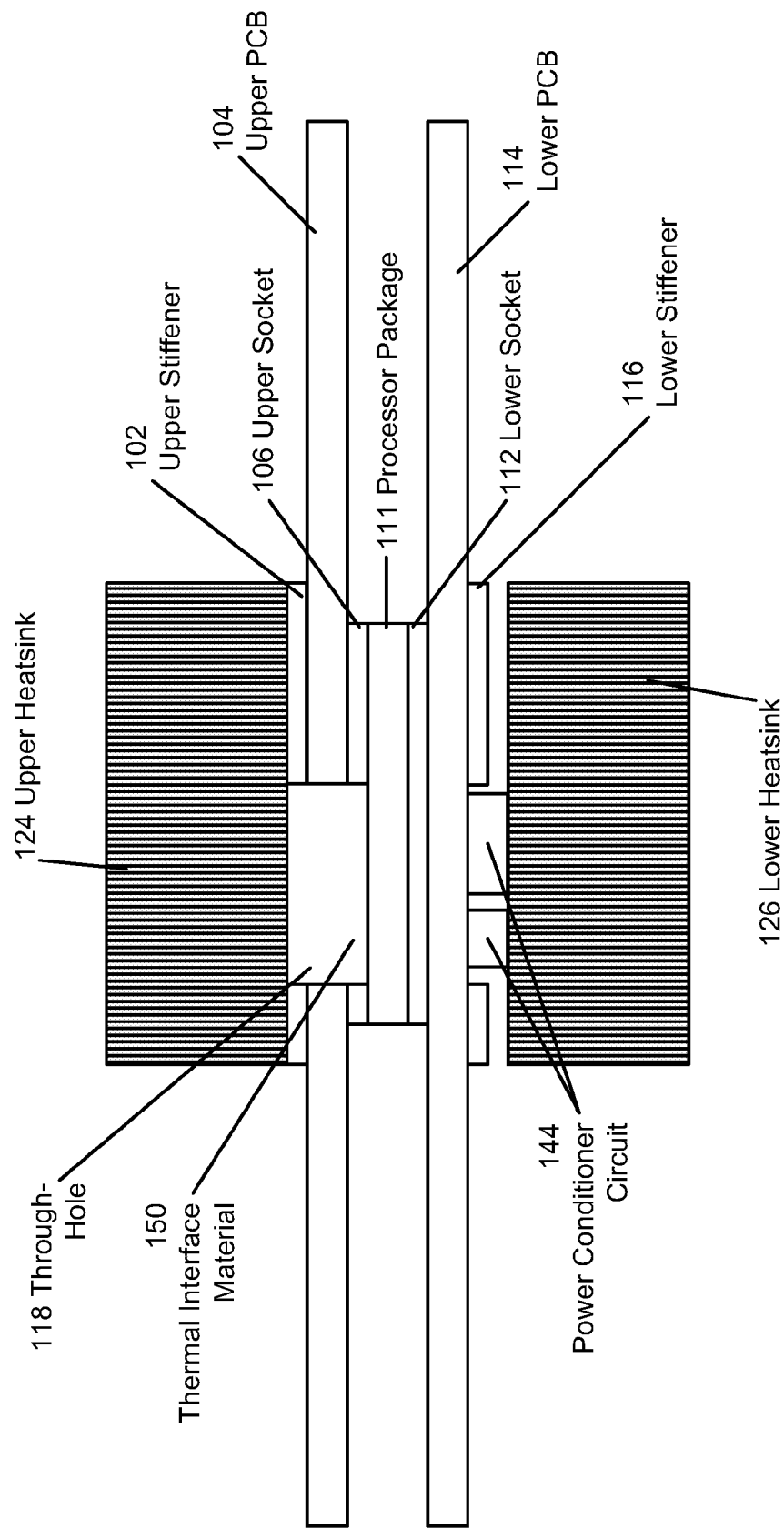
FIG. 7 shows a cross-sectional side view of a PCB module with an upper heatsink, a lower heatsink and power conditioner circuits in accordance with one or more embodiments of the technology.

FIG. 7 shows a cross-sectional side view of a PCB module with an upper heatsink (124), a lower heatsink (126) and power conditioner circuits (144), in accordance with one or more embodiments of the technology. The power conditioner circuits may include a voltage controller, metal-oxide-semiconductor field-effect transistors (MOSFETs), capacitors, inductors, etc. The voltage regulator may, for example, convert a 12 volt input voltage to a voltage to be supplied to the processor package. Power vias through the lower PCB (114) may interface the processor in the processor package with the voltage regulator.

The upper PCB (104), in accordance with an embodiment of the technology, includes an upper stiffener (102) attached to the upper surface and the lower PCB (114) includes a lower stiffener (116) attached to the lower surface. The upper stiffener (102) may have an upper heatsink (124) installed on its upper surface. The upper heatsink may be in contact with the processor package (111) via the thermal interface material (150) as shown in FIG. 7, or directly, thus not requiring a thermal interface material. Further, a lower heatsink (126) may be installed below the lower stiffener (116). The lower stiffener may have a cutout to accommodate the power conditioning circuits (144). Some or all elements of the power conditioning circuits (144) may be in direct or indirect (via a thermal interface material) surface contact with the lower heatsink (126).

Figure 8:
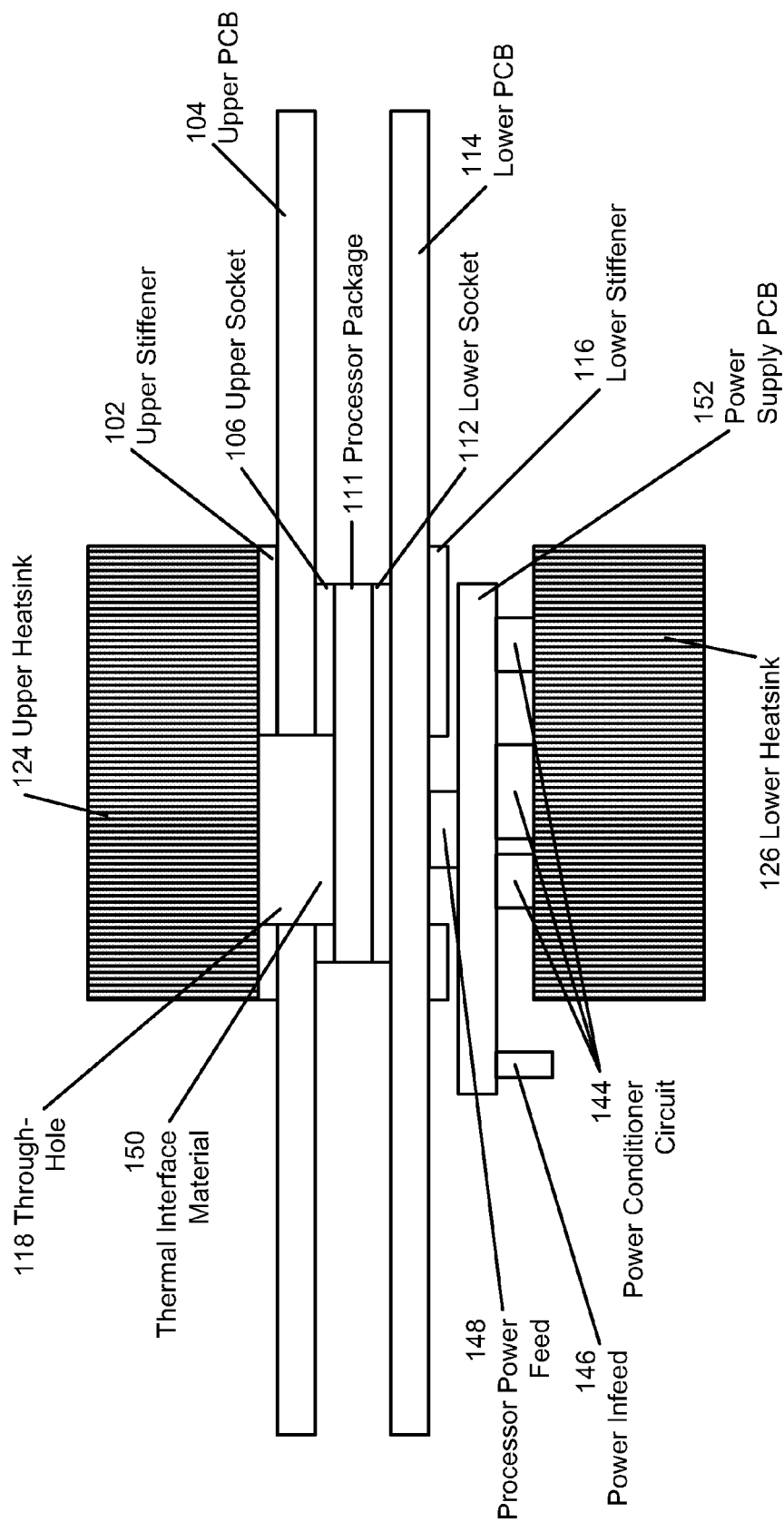
FIG. 8 shows a cross-sectional side view of a PCB module with an upper heatsink, a lower heatsink and power conditioner circuits in accordance with one or more embodiments of the technology.

FIG. 8 shows a cross-sectional side view of a PCB module with an upper heatsink, a lower heatsink and power conditioner circuits in accordance with one or more embodiments of the technology.

The power conditioner circuits (144) may be located on a separate power supply PCB (152) located below the lower PCB (114). A power infeed (146) may provide power, e.g., from a power supply to the power conditioning circuits (144) on the power supply PCB. A processor power feed (148) may provide the regulated power, obtained from the power conditioning circuits, to the processor package (111) via the lower PCB (114). Accordingly, the lower and/or upper PCB (112, 106) may be designed without a power supplying infrastructure for the processor package.

The upper PCB (104), in accordance with an embodiment of the technology, includes an upper stiffener (102) attached to the upper surface and the lower PCB (114) includes a lower stiffener (116) attached to the lower surface. The upper stiffener (102) may have an upper heatsink (124) installed on its upper surface. The upper heatsink may be in contact with the processor package (111) via the thermal interface material (150) as shown in FIG. 8, or directly, thus not requiring a thermal interface material. Further, a lower heatsink (126) may be installed on the power supply PCB (152). Some or all elements of the power conditioning circuits (144) may be in direct or indirect (via a thermal interface material) surface contact with the lower heatsink (126). The lower stiffener may have a cutout to accommodate the processor power feed (148).

Figure 9:
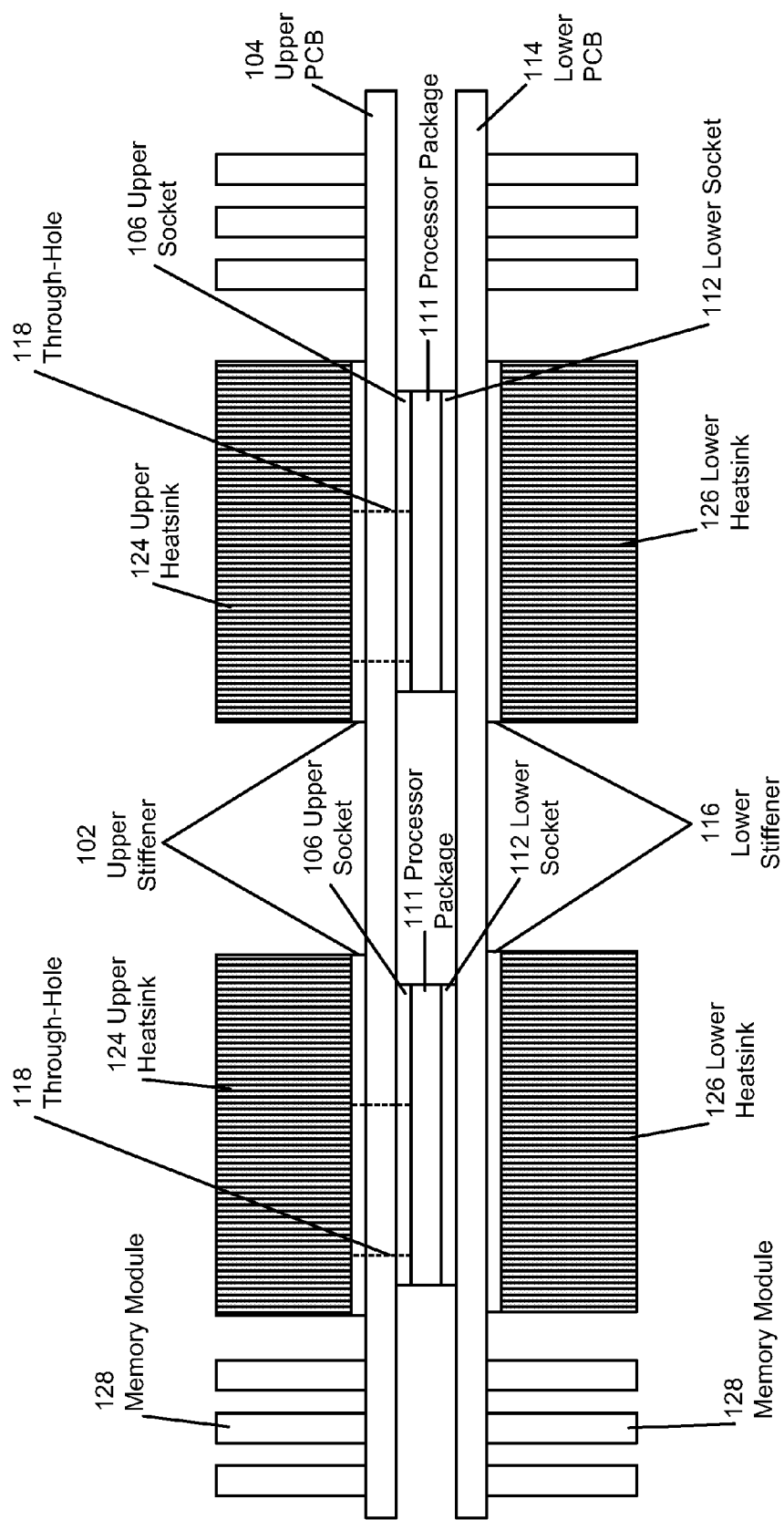
FIG. 9 shows a side view of a PCB module with a multi-processor configuration in accordance with one or more embodiments of the technology.

FIG. 9 shows a side view of a PCB module with a multi-processor configuration in accordance with one or more embodiments of the technology. The PCB module may have two upper sockets (106), two processor packages (111), and two lower sockets (112) sandwiched between the upper PCB (104) and lower PCB (114). Further, an upper heatsink (124) may be installed on each of the upper stiffeners (102), and a lower heatsink (126) may be installed on each of the lower stiffeners (116). Thus, the embodiment shown in FIG. 9 may be used in a dual-processor setup. One of ordinary skill in the art will appreciate that the technology is not limited to a dual-processor setup. Additional processors may be supported by adding additional sockets, processor packages, and stiffeners, etc.

In one or more embodiments of the technology, e.g., in the exemplary embodiments shown in FIGS. 1A-9, the upper heatsink (124) and/or the lower heatsink may perform the function of the stiffeners (102, 116). In other words, the heatsinks themselves may provide structural rigidity to the PCBs. The heatsinks may, for example, be combined with the stiffener element to form a single discrete element. However, the heatsinks may also augment the function of independent stiffeners by providing additional structural rigidity to a PCB module.

Additionally, in one or more alternative embodiments of the technology, the upper heatsink and the lower heatsink may be thermally coupled by, for example, one or more heat pipes. The heat pipes may either protrude through the upper PCB and the lower PCB or extend around each PCB to thermally connect the upper heatsink to the lower heatsink.

In one or more embodiments of the technology, one or more electrical components (or connectors) are located between an upper PCB and a lower PCB in addition to or as an alternative to a processor package. In other words, in one or more alternative embodiments the sockets and processor package may be replaced with an alternate electrical component or electrical connections such as, for example, a high density switch chip requiring a very large number of interfaces, a bridging PCB circuit, electrical cabling, or optical cabling with an electrical/optical coupler. Furthermore, the alternate electrical connection may be in addition to one or more sockets and processor packages such as electrical serializers, de-serializers and/or optical transceivers.

One skilled in the art will recognize that the architecture of a PCB module for increased connectivity is not limited to the exemplary embodiments shown in FIGS. 1A-9. For example, different design combinations of PCB sizes, heatsinks, stiffeners, processor sockets and processor packages are feasible, in accordance without departing from the technology.

Embodiments of the technology may enable the design of electronic circuits with increased connectivity. More specifically, the addition of a second PCB that, in accordance with one or more embodiments of the technology, also interfaces with the processor package, enables the design of processors with additional electrical interfaces. For example, a processor or switch in accordance with an embodiment of the technology, may have additional memory and/or input/output interfaces that may not be feasible in processor designs that are limited to an electrical interface at the bottom surface of the processor package. With the availability of additional electrical interfaces, additional electronic components such as memory modules, I/O interfaces, etc. may be connected to the processor. The additional electronic components may be accommodated on the surface area available on the upper and/or the lower PCB. If the power conditioning circuits associated with the processor are located under the processor package, additional space on the PCBs may become available for other electronic components. Further, positioning the power conditioning circuits in proximity of the processor (e.g., directly under the processor package) shortens the low voltage, high current traces between the power conditioning circuits and the processor, thus reducing losses and reducing electromagnetic interference (EMI) challenges. Further, locating the power conditioning circuits on a separate PCB may simplify the routing of traces on the upper and lower PCBs because at least some of the power-carrying traces may be eliminated from these boards. Embodiments of the technology, with the availability of upper and lower heatsinks, may further offer superior cooling of electronic components.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:

1. A printed circuit board (PCB) module, comprising:
a processor package comprising a processor substrate and a processor;
an upper PCB;
an upper socket disposed on a lower surface of the upper PCB, wherein the upper socket electrically connects to a top electrical interface on the upper surface of the processor substrate;
a lower PCB, wherein the lower PCB electrically interfaces with a bottom electrical interface on a lower surface of the processor substrate;
a lower stiffener disposed on a lower surface of the lower PCB; and
an upper stiffener disposed on an upper surface of the upper PCB.

2. The PCB module of claim 1, further comprising:
a lower socket, disposed on an upper surface of the lower PCB, wherein the lower socket electrically connects the lower PCB to the bottom electrical interface on the lower surface of the processor substrate.

3. The PCB module of claim 1, further comprising:
a through-hole in the upper socket and in the upper PCB.

4. The PCB module of claim 3, wherein the processor extends into the through-hole.

5. The PCB module of claim 3, wherein a thermal interface material is disposed in the through-hole.

6. The PCB module of claim 1, further comprising:
an upper heatsink disposed above the upper PCB, and thermally connected to a top surface of the processor.

7. The PCB module of claim 1, further comprising:
a lower heatsink disposed below the lower PCB, and thermally connected to the lower PCB.

8. The PCB module of claim 1, wherein the upper PCB further comprises at least one selected from a group consisting of a memory module, a chip, a transceiver, and an input/output device, disposed on the upper surface of the upper PCB.

9. The PCB module of claim 1, wherein the upper PCB further comprises an accessory card disposed on the upper surface of the upper PCB.

10. The PCB module of claim 1, wherein the lower PCB further comprises a memory module disposed on the lower surface of the lower PCB.

11. The PCB module of claim 1, wherein the lower PCB further comprises an accessory card socket disposed on the lower surface of the lower PCB.

12. The PCB module of claim 1, wherein the upper PCB comprises a first plurality of fastening points, and wherein the lower PCB comprises a second plurality of fastening points.

13. The PCB module of claim 12, wherein each of the fastening points of the first and the second plurality of fastening points is secured by at least one selected from a group consisting of a screw, a bolt, a retention clip, a spring, and an adhesive, configured to mechanically link the upper PCB and the lower PCB.

14. The PCB module of claim 1, wherein the bottom electrical interface at the lower surface of the processor substrate is one selected from a group consisting of a ball grid array (BGA), a land grid array (LGA) and a pin grid array (PGA).

15. The PCB module of claim 1, wherein the top electrical interface at the upper surface of the processor substrate is one selected from a group consisting of a land grid array (LGA) and a pin grid array (PGA).

16. The PCB module of claim 1, wherein power conditioning circuits, configured to supply power to the processor, are disposed in a region under the processor package.

17. The PCB module of claim 16, wherein the power conditioning circuits are disposed on a power supply PCB, separate from the lower PCB.

18. The PCB module of claim 1, further comprising:
a second processor package comprising a second processor substrate and a second processor;
wherein the upper PCB further comprises:
a second upper socket disposed on the lower surface of the upper PCB,
wherein the second upper socket electrically connects to a top electrical interface on an upper surface of the second processor substrate; and
wherein the lower PCB further electrically interfaces with a bottom electrical interface on a lower surface of the second processor substrate.

* * * * *